(12) United States Patent
Donohoe

(10) Patent No.: US 6,204,604 B1
(45) Date of Patent: *Mar. 20, 2001

(54) METHOD AND APPARATUS FOR CONTROLLING ELECTROSTATIC COUPLING TO PLASMAS

(75) Inventor: Kevin G. Donohoe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/275,275

(22) Filed: Mar. 23, 1999

Related U.S. Application Data

(63) Continuation-in-part of application No. 09/020,696, filed on Feb. 9, 1998, now Pat. No. 5,998,931.

(51) Int. Cl.[7] ........................................................ H01J 7/24
(52) U.S. Cl. ................................ 315/111.21; 315/111.51; 315/344; 118/723 I; 118/723 R
(58) Field of Search ......................... 315/111.21, 111.71, 315/111.51, 248, 344; 118/723 I, 723 IR, 723 ER, 723 R, 723 MP; 156/345

(56) References Cited

U.S. PATENT DOCUMENTS

| | | | |
|---|---|---|---|
| 5,619,103 | * 4/1997 | Tobin et al. | 315/111.21 |
| 5,637,961 | * 6/1997 | Ishii et al. | 315/111.51 |
| 5,800,619 | * 9/1998 | Holland et al. | 118/723 I |
| 6,123,802 | * 9/2000 | Donohoe | 156/345 |

* cited by examiner

Primary Examiner—Haissa Philogene
(74) Attorney, Agent, or Firm—Dorsey & Whitney LLP

(57) ABSTRACT

An inductively coupled plasma-based device for use during integrated circuit fabrication is described which includes a planar coil electrode positioned adjacent to a dielectric structure physically separating the electrode from a reaction chamber in which a plasma is formed. The electrode presents a variable width adjacent to the dielectric structure, with the width of inner coil windings being less than the width of outer coil windings. The electrode is connected to a terminal capacitance, whose value may be varied to present different voltage amplitudes at different locations along the coil electrode. By locating the larger width coil windings near the reaction chamber walls, and by varying the capacitance value of the terminal capacitor, improved plasma-based processing may result.

44 Claims, 4 Drawing Sheets

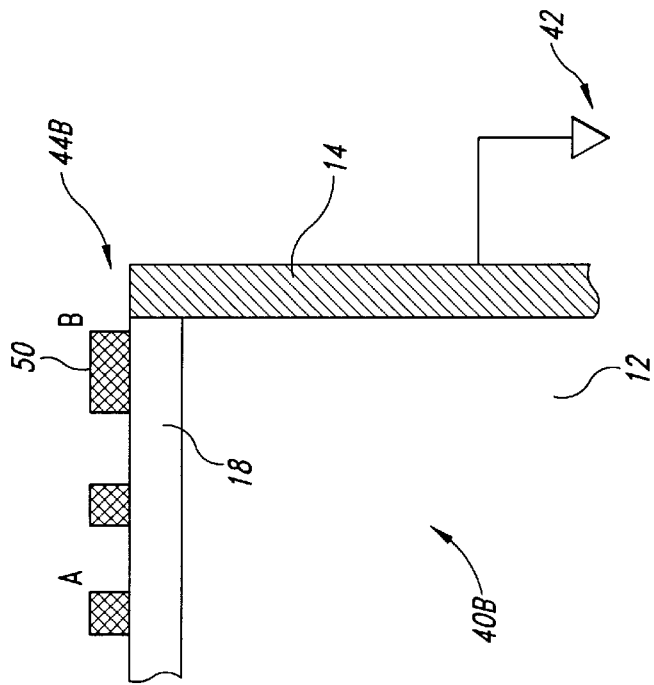
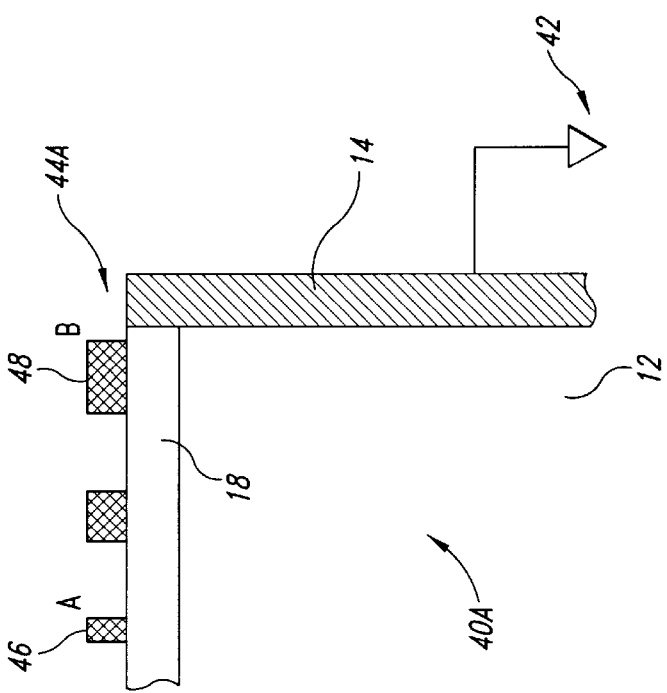

METHOD AND APPARATUS FOR CONTROLLING ELECTROSTATIC COUPLING TO PLASMAS

CROSS-REFERENCES TO RELATED APPLICATIONS

This application is a continuation-in-part of U.S. utility patent application Ser. No. 09/020,696, filed Feb. 9, 1998, now U.S. Pat. No. 5,998,931.

TECHNICAL FIELD

This invention relates generally to igniting and sustaining plasmas, and more particularly to methods and apparatus for controlling electrostatic coupling to plasmas.

BACKGROUND OF THE INVENTION

Integrated circuits are commonly fabricated on and within a surface region of a semiconductor substrate, such as a wafer of silicon. During such fabrication, various layers are produced within the substrate or deposited thereon. Some of these layers are then sized and dimensioned to form desired geometric patterns by means of various etching techniques. Such etching techniques include "wet" etching techniques, which typically use one or more chemical reagents brought into direct contact with the substrate, or "dry" etching techniques such as plasma etching.

Numerous plasma-based etching techniques are known in the art, including what is commonly called the plasma etching mode, as well as reactive ion etching and reactive ion beam etching. In any of the wide variety of plasma etching techniques, a plasma is created from gas introduced into a reaction chamber. One or more electrodes (commonly driven by an RF generator) generate the plasma by disassociation of the gas molecules into various ions, free radicals, and electrons. The plasma then reacts with material being etched from the semiconductor wafer.

FIG. 1 depicts the major components of a prior art plasma etching system 10, such as the Lam 9100, manufactured by Lam Research, Inc. The etching system 10 includes a reaction chamber 12 having a chamber wall 14, which is typically grounded. An electrode, such as a planar coil electrode 16, is positioned adjacent to a dielectric structure 18 separating the electrode 16 from the interior of the reaction chamber 12. Source gases, from which the plasma is generated, are provided by a gas supply 20. The gas supply 20 is coupled with the reaction chamber 12 by a gas control panel 22, which selects and controls the flow of source gases into the chamber. Volatile reaction products, unreacted plasma species, and other gases are removed from the reaction chamber 12 by a gas removal mechanism, such as a vacuum pump 24 and throttle valve 26.

The dielectric structure 18 depicted in FIG. 1 may serve multiple purposes and have correspondingly multiple structural features, as is well known in the art. For example, the dielectric structure 18 may include features for introducing the source gases into the reaction chamber 12, as well as those structures associated with physically separating the electrode 16 from the interior of the chamber.

Electrical power such as a high voltage signal is applied to the electrode 16 to ignite and sustain a plasma within the reaction chamber 12. The high voltage signal is provided by a power generator, such as an RF generator 28. The RF generator 28 is coupled with one end of the planar coil electrode 16 by a matching network 30, which functions primarily to match impedances, as is well known in the art. The other end of the planar coil electrode 16 is coupled to ground potential by a terminal capacitor 32 or $C_T$. The terminal capacitor $C_T$ is oftentimes included within the matching network 30, but is depicted separately in FIG. 1 for illustrative purposes.

Ignition of a plasma within the reaction chamber 12 occurs primarily by electrostatic coupling of the electrode 16 with the source gases, due to the large magnitude voltage applied to the electrode and the resulting electric fields produced within the reaction chamber. Once ignited, the plasma is sustained by electromagnetic induction effects associated with a time-varying magnetic fields caused by the alternating currents applied to the electrode 16. A semiconductor wafer 34 is positioned within the reaction chamber 12 and is supported by a wafer platform or chuck 36. The chuck 36 is typically electrically biased to provide ion energies impacting the wafer 34 that are approximately independent of the RF voltage applied to the electrode 16.

Typically, the voltage varies as a function of position along the coil electrode 16, with relatively higher amplitude voltages occurring at certain positions along the electrode 16, and relatively lower amplitude voltages occurring at other positions along the electrode. A large electric field strength is required to ignite plasmas within he reaction chamber 12. To create such a field, it is desirable to provide the relatively higher amplitude voltages at locations along the electrode 16 which are close to the grounded chamber wall 14.

Referring to FIG. 2, a graphical representation depicts the relative amplitudes of the voltages at locations along the electrode 16, with location A representing a position near the center of the coil electrode and location B representing a location near an outer end of the electrode (see FIG. 1). For the coil electrode 16 used in the Lam 9100, selecting a relatively small capacitance value for the terminal capacitor $C_T$ produces the higher amplitude voltages at location B, whereas selecting a relatively large capacitance value produces the higher amplitude voltages at location A. Thus, in this example, selecting a relatively small capacitance value for the terminal capacitor $C_T$ enhances efficient ignition of plasmas within the reaction chamber 12. Of course, voltage amplitudes produced by electrodes of different configurations and/or effective electrical lengths may vary with $C_T$ other than described for the electrode 16.

As is known to those skilled in the art, producing the relatively higher amplitude voltages at positions away from the center of the electrode 16 results in improved etching uniformity, especially improved uniformity of etching depth and profile. However, locating the relatively higher amplitude voltages near the grounded chamber wall 14 also can result in increased sputtering effects on the dielectric structure 18. The electric field between the chamber wall 14 and the dielectric structure 18 causes ion impact on the dielectric structure. This may sputter polymer or other deposits from the dielectric structure, or sputter the dielectric structure itself, and possibly cause contamination of the semiconductor wafer 34. Thus, an unfortunate tradeoff exists in which conditions conducive to plasma ignition and etching uniformity also increase potential contamination effects.

A conventional PECVD system is similarly constructed to the conventional plasma etching system shown in FIG. 1. A conventional PECVD system typically includes the reaction chamber 12, the gas removal system, such as the vacuum pump 24 and the throttle valve 26, the gas supply 20 and the gas control panel 22, and the RE generator 28. The RF generator is coupled to one end of the planar coil electrode 16 by the matching network 30. The other end of the planar coil electrode 16 is coupled to ground by the terminal capacitor 32. However, an important difference between conventional PECVD systems and plasma etching systems is that the gas supply 20 contains the reactants for depositing a material rather than for etching a material.

As is generally known to those skilled in the art, the properties of a material deposited by a PECVD system may be altered by adjusting the strength of electrostatic coupling between the electrode 16 and the source gases within the reaction chamber 12. For example, after effective ignition of the plasma, the strength of electrostatic coupling may be adjusted so that ionization of the source gas near a gas inlet is reduced. Reducing, or for that matter, increasing, the strength of the electrostatic coupling near the gas inlet of the source gases will alter the deposition rate, as well as other properties of the deposited material, such as film uniformity, stoichiometry, stress, and conformality.

As mentioned previously, electrostatic coupling between the electrode 16 and source gases may be adjusted by varying the voltage amplitudes at various locations along the electrode 16. The voltage amplitudes are varied in conventional plasma systems by adjusting the capacitance value of the terminal capacitor $C_T$. However, as also mentioned previously, shifting the relative strength of electrostatic coupling in such a manner may aggravate other disadvantages, for example, decreasing film uniformity, and increasing chamber contamination.

SUMMARY OF THE INVENTION

An inductively coupled plasma-based device for use during integrated circuit fabrication is provided. In one embodiment, the plasma-based device includes a reaction chamber adapted to receive the integrated circuit and gas from which a plasma is formed. An electrode is positioned proximate to the reaction chamber and is operable to produce an electric field for application to the gas within the reaction chamber to ignite a plasma therewithin. The electrode is configured as a substantially planar coil electrode and presents a variable width towards the reaction chamber. A dielectric structure is positioned between the electrode and the reaction chamber.

In another embodiment, the inductively coupled plasma-based device is a plasma enhanced depositing device for depositing selected materials to a semiconductor structure. The depositing device includes a reaction chamber adapted to receive the integrated circuit and gas from which a plasma is formed, and an electrode is positioned proximate to the reaction chamber to produce an electric field within the reaction chamber. The electrode is configured as a substantially planar coil electrode and presents a variable width towards the reaction chamber.

In another embodiment, the inner windings of the coil electrode are smaller in width than the outer windings. The electrode may be connected to a terminal capacitance, whose value may be varied to present different voltage amplitudes at different locations along the coil electrode. By locating the larger width coil windings near the reaction chamber walls, and by varying the capacitance value of the terminal capacitor during plasma etching processing, improved plasma ignition, etching uniformity, and contamination conditions may result.

BRIEF DESCRIPTION OF THE DRAWINGS

FIG. 4 is a partial cross-sectional view of the plasma etching device of FIG. 3.

FIG. 5 is a partial cross-sectional view depicting a plasma etching device in accordance with a second embodiment of the present invention.

DETAILED DESCRIPTION OF THE INVENTION

In the following description, certain specific details are set forth in order to provide a thorough understanding of various embodiments of the present invention. However, one skilled in the art will understand that the present invention may be practiced without these details. In other instances, well-known structures associated with plasma etching devices and systems have not been shown in detail, to avoid unnecessarily obscuring the description of the embodiments of the invention.

Figure 1:
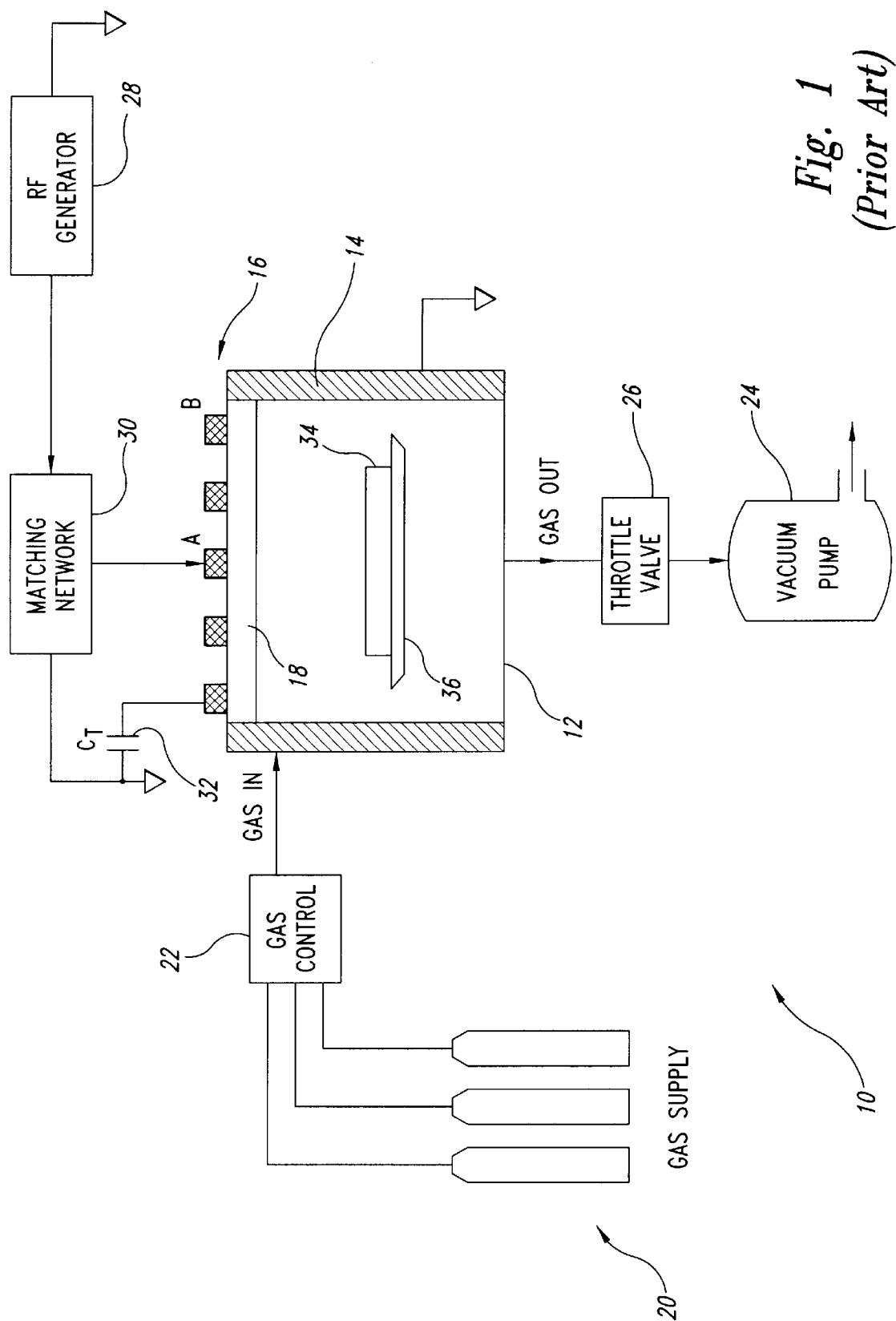
FIG. 1 is a part functional block, part cross-sectional diagram depicting an etching system in accordance with the prior art.

As described above in connection with the prior art, conditions associated with efficient plasma ignition and improved etching uniformity are also associated with increased potential for wafer contamination and chamber wear. As is known to those skilled in the art, source gases used for production of plasma-based etching ions also produce polymers, which are generally not desired as part of the integrated circuit fabrication process. This is especially true for those fluorocarbon source gases commonly used for etching silicon and silicon-dioxide. Ideally, interaction of the polymers and the wafer to be etched should be minimized. Generally, polymers deposit in appreciable quantities on those surfaces not subject to significant ion bombardment. Such surfaces include the reaction chamber wall 14 and the dielectric structure 18 described above in connection with FIG. 1. If, however, portions of these surfaces are subject to significant ion bombardment, polymers are sputtered into the reaction chamber and unsatisfactory processing of the semiconductor wafer 34 may result.

The capacitance value of the terminal capacitor $C_T$ can be varied, and varying this value during the etching process may be done to produce voltages at locations suitable for effective ignition of the plasma initially, while moving the location of the relatively higher amplitude voltages to locations to minimize polymer sputtering. The location of the relatively higher amplitude voltages can also be moved by adjusting the frequency of the applied voltage signal. However, as described above in connection with the prior art, such movement of the location of high amplitude voltages may result in degraded etching uniformity.

Figure 3:
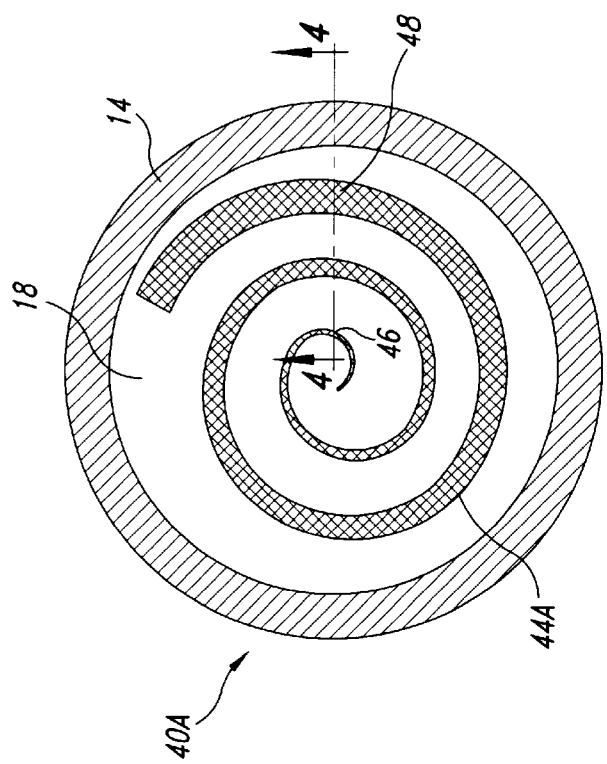
FIG. 3 is a top view depicting a plasma etching device in accordance with a first embodiment of the present invention.
Figure 2:
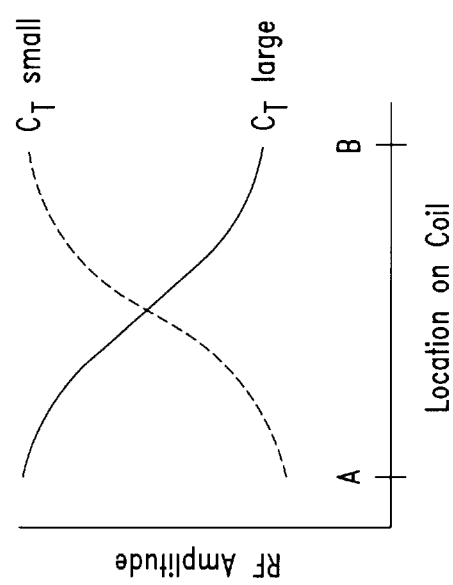
FIG. 2 is a graphical representation of voltage amplitudes as a function of location along a coil electrode included in the etching system of FIG. 1.

FIG. 3 depicts a top view and FIG. 4 depicts a partial cross-sectional view of a plasma etching device 40A in accordance with a first embodiment of the present invention. Shown are portions of the reaction chamber 12, the chamber wall 14, and the dielectric structure 18 described above in connection with FIG. 1. The chamber wall 14 is connected to a controlled voltage, such as a source of approximately constant voltage like ground potential 42. The etching device 40A includes a planar coil electrode 44A positioned adjacent to the dielectric structure 18. As shown, the width of the electrode 44A positioned adjacent to the dielectric structure 18 varies, with a winding 46 of relatively small width positioned near the center of the dielectric structure 18 and a winding 48 of relatively large width positioned near an outer edge of the dielectric structure.

As described above in connection with the prior art, the strength of electrostatic coupling between the electrode 44A and source gases within the reaction chamber 12 depends on the voltage amplitudes at various locations along the electrode. The strength of electrostatic coupling depends both on electric field strength and on capacitive coupling between the electrode and the sources gases. Thus, the strength of electrostatic coupling depends on the various widths of the coil windings, which characterize the various areas or "footprint" of the electrode disposed towards the dielectric structure 18 and the reaction chamber 12. Those skilled in the art will understand that, in the context of the present description, the phrase "electrostatic coupling" is intended to encompass any of a variety of electric field-based interactions, whether constant or time varying.

The electrode 44A having a variable width then provides an additional means for controlling electrostatic coupling between the electrode and source gases within the reaction chamber 12. The electrode 44A shown in FIGS. 3 and 4 has an approximately continuously varying width, with the winding located between windings 46 and 48 having an intermediate width. FIG. 5 shows a partial cross-sectional view depicting a plasma etching device 40B in accordance with a second embodiment of the present invention. In this case, a planar coil electrode 44B is provided in which an outermost winding 50 of the electrode presents a relatively large width adjacent to the dielectric structure 18, whereas the other windings all have approximately the same width. The electrode 44B then accentuates the local capacitive coupling at those regions within the reaction chamber 12 near the grounded chamber wall 14.

Figure 6:
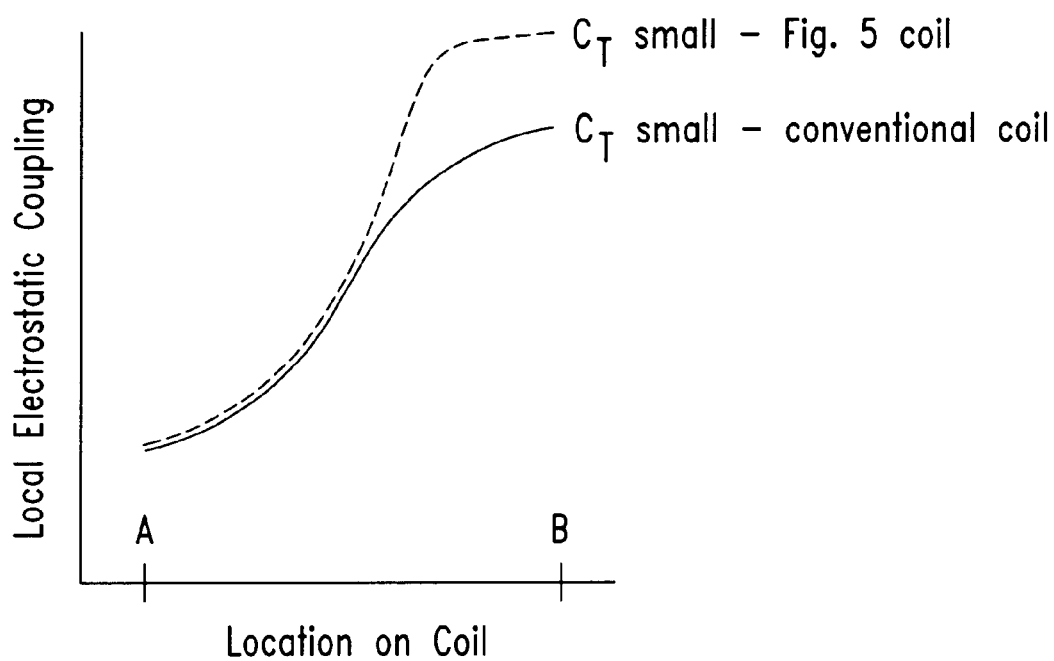
FIG. 6 is a graphical representation comparing the local amplitudes of electrostatic coupling produced by a coil electrode included in the etching device of FIG. 5 and by the coil electrode included in the etching system of FIG. 1.

Either of the electrodes 44A and 44B may be readily adapted for use in an etching system, such as the plasma etching system 10 described above in connection with FIG. 1. FIG. 6 is a graphical representation contrasting the local amplitude of electrostatic coupling as a function of location along the coil electrode 44B of FIG. 5 with that of the standard coil electrode 16 of FIG. 1. The two graphs shown correspond to the same relatively small capacitance value for the terminal capacitor $C_T$. As shown in FIG. 6, the electrostatic coupling provided by the electrode 44B is more pronounced and farther extending at locations near the chamber wall 14, thereby significantly improving the localized coupling of power to corresponding regions within the reaction chamber.

Those skilled in the art will understand that the electrical power applied to the electrodes 44A or 44B produces electric fields within various regions of the reaction chamber 12. Because of the variable width of the electrode 44A or 44B, the spatial extent of the individual regions to which the electric fields are applied vary correspondingly. For example, a first amplitude electric field is applied to a first region of the reaction chamber corresponding to an outwardly disposed electrode winding, whereas a second amplitude electric field is applied to a second region of the reaction chamber corresponding to an inwardly disposed electrode winding. The first and second regions are substantially disjoint (i.e., having essentially no points in common) and differ in relative spatial extent, as determined by the relative widths of the windings. The relative strengths of the first and second amplitude electric fields may also differ, or may be the same or vary with time.

The variable width of an electrode constructed in accordance with an embodiment of the present invention is one example of, more generally, providing a variable localized capacitive coupling to regions within the reaction chamber. Those skilled in the art will appreciate that parameters other than coil width could be adjusted to provide such variable coupling, such as by locating portions of an electrode at various distances from the reaction chamber.

By using the variable width electrode 44A or 44B in combination with a variable terminal capacitor $C_T$ (see FIG. 1), a number of advantages may be achieved over the prior art. For example, a relatively small capacitance value for the terminal capacitor $C_T$ may be employed initially to ignite a plasma within the reaction chamber 12. The increased electrostatic coupling provided by the larger width windings of electrode 44A or 44B can advantageously augment this plasma ignition. Following plasma ignition, the capacitance value of the terminal capacitor $C_T$ may be adjusted to a relatively large value, thereby avoiding significant ion bombardment effects on the dielectric structure 18 and the contamination resulting therefrom.

Relative to the scale of the electrode as a whole, the size or "footprint" of inner windings of the electrode 44A or 44B are smaller than those of prior art electrodes. Thus, the decreased etching uniformity associated with applying higher voltage amplitudes to the center windings may be avoided in accordance with embodiments of the present invention. Alternatively, other advantages might be provided by electrodes having a larger inner winding footprint than is associated with conventional electrodes. More generally, electrodes constructed in accordance with embodiments of the present invention provide an additional parameter— namely, coil winding width—that can be adapted and manipulated in plasma etching system design. Thus, the present invention provides a means for improving upon those trade-offs associated with prior art etching systems.

An electrode constructed in accordance with embodiments of the present invention also provides other advantages for plasma related systems, including both plasma etching systems, such as one previously described, and plasma enhanced CVD ("PECVD") systems that are used to deposit material onto a semiconductor wafer.

An electrode having a variable width, such as 44A or 44B (FIGS. 4 and 5), can accommodate the disadvantages described above by being shaped in a manner that either minimizes or enhances the deposition reaction in certain regions within the reaction chamber 12. As mentioned previously, the strength of electrostatic coupling between the electrode 44A or 44B and source gases may also be adjusted by varying the area through which the coupling occurs. That is, adjusting the width of the electrode 44A or 44B. Thus, using an electrode 44A or 44B having a variable width provides an additional means for controlling the strength of electrostatic coupling between the electrode and source gases, and consequently, provides another means for altering the properties of the deposited material.

Further advantages provided by the embodiments of the present invention relate to optimizing the utilization of the reaction chamber 12. As is well known in the art, incidental deposition of materials onto the interior surface of the reaction chamber 12 occurs during a plasma related process. The incidental deposition occurs for both plasma etch and deposition processes. Therefore, in order to maintain the cleanliness of the reaction chamber 12, it must be cleaned regularly. Cleaning of the reaction chamber 12 typically involves generating a plasma from a source gas that reacts with the incidentally deposited material, and using the ionized gas to etch away the deposited material. In some cases, up to 50 percent of the reaction chamber utilization time is devoted to cleaning.

Using a planar coil electrode 44A or 44B having a variable width provides two benefits to the chamber cleaning process. One advantage to using an electrode 44A or 44B is greater flexibility in managing the incidental deposition during a plasma related process. As mentioned previously with regards to plasma etching processes, incidental deposition of material onto the interior of the reaction chamber 12 is generally greater in regions where the strength of electrostatic coupling is relatively less. Conversely, incidental deposition is less in regions where the strength of electrostatic coupling is relatively greater, due in part to the sputtering effect from ion bombardment. These general rules hold true for plasma enhanced deposition processes as well.

Although incidental deposition may be managed to a certain degree by adjusting the capacitance value of the terminal capacitor $C_T$, using an electrode 44A or 44B having a variable width, in addition to adjusting the terminal capacitance $C_T$, may provide flexibility in managing incidental deposition not possible with a conventional coil electrode 16. For example, an electrode 44A or 44B may be shaped in a manner that minimizes incidental deposition in regions of the reaction chamber 12 that should remain relatively clean, but nevertheless maintains the balance between other process considerations, such as ease of plasma ignition, film uniformity and stoichiometry, and etch or deposition rates.

Another advantage realized by an electrode 44A or 44B having a variable width is optimizing cleaning of the reaction chamber 12. Optimization may result in shorter cleaning times, less wear on reaction chamber parts, and more efficient use of source gases. An electrode 44A or 44B can be shaped in a manner that enhances ion bombardment or the reactivity of source gases in regions of the reaction chamber 12 that are difficult to clean, or have greater incidental deposition. As mentioned previously, adjusting the capacitance value of the terminal capacitor $C_T$, provides one degree of flexibility in adjusting electrostatic coupling within regions of the reaction chamber 12. However, even greater flexibility can be attained by taking advantage of the fact that the relative strength of electrostatic coupling may also be adjusted by using an electrode 44A or 44B having a variable width.

It will be appreciated that, although embodiments of the invention have been described above for purposes of illustration, various modifications may be made without deviating from the spirit and scope of the invention. For example, those skilled in the art will appreciate that a number of alternative electrode configurations may be suitably adapted to selectively apply electromagnetic fields (whether solely electric fields, magnetic fields, or a combination of the two) to disparate regions of varying spatial extent, or to otherwise vary the strength of local coupling of electromagnetic power to various regions. Accordingly, the scope of the invention is not limited by the disclosure of particular embodiments, and terms used in the following claims should not be construed to limit the invention to these embodiments. Instead, the scope of the invention is determined entirely by the following claims.

What is claimed is:

1. An inductively coupled plasma device for use during integrated circuit fabrication, comprising:

a reaction chamber having an interior and being adapted to receive an integrated circuit; and an electrode having first and second widths disposed towards the reaction chamber, the first and second widths being unequal to produce unequal localized electrostatic coupling strengths within the interior of the reaction chamber.

2. The inductively coupled plasma device of claim 1, further comprising a dielectric structure disposed between the reaction chamber and the electrode.

3. The inductively coupled plasma device of claim 1 wherein the width of the electrode varies approximately continuously along the electrode.

4. The inductively coupled plasma device of claim 1 wherein the first width of the electrode is less than the second width of the electrode.

5. The inductively coupled plasma device of claim 1 wherein the second width of the electrode is less than the first width of the electrode.

6. The inductively coupled plasma device of claim 1 wherein the reaction chamber is further adapted for depositing selected materials to the integrated circuit.

7. The inductively coupled plasma device of claim 1 wherein reaction chamber further comprises an interior surface, and the first and second widths of the electrode are adapted to remove material from the interior surface of the reaction chamber.

8. An inductively coupled plasma device for fabricating semiconductor structures, comprising:

a reaction chamber adapted to receive the semiconductor material upon which the semiconductor structures are fabricated and gas from which a plasma is formed; and an electrode positioned proximate to the reaction chamber and operable to produce an electromagnetic field for application to the gas within the reaction chamber to ignite a plasma therewithin, the electrode being configured as a substantially planar coil electrode having a variable width disposed towards the reaction chamber.

9. The inductively coupled plasma device of claim 8, further comprising a dielectric structure positioned between the electrode and the reaction chamber.

10. The inductively coupled plasma device of claim 8 wherein the width of an outer portion of the electrode is greater than the width of an inner portion of the electrode.

11. The inductively coupled plasma device of claim 8 wherein the width of the electrode varies approximately continuously along the electrode.

12. The inductively coupled plasma device of claim 8 wherein the electrode includes first and second portions, the width of each of the first and second portions being approximately constant, the width of the first portion being greater than the width of the second portion.

13. The inductively coupled plasma device of claim 8, further comprising a variable capacitor coupled with the electrode, the capacitor operable to adjust the amplitude of an electric field produced by the electrode as a function of position along the electrode.

14. The inductively coupled plasma device of claim 8 wherein the electrode includes first and second portions, the width of the first portion being greater than the width of the second portion, and wherein the electrode is operable to produce first and second electric field amplitudes at locations within the reaction chamber corresponding to the first and second portions of the electrode, respectively.

15. The inductively coupled plasma device of claim 8 wherein the electrode includes first and second portions, the width of the first portion being greater than the width of the second portion, and wherein the electrode is operable to produce first and second electric field amplitudes at locations within the reaction chamber corresponding to the first and second portions of the electrode, respectively, the first electric field amplitude being greater than the second electric field amplitude.

16. The inductively coupled plasma device of claim 8 wherein the electrode includes first and second portions, the width of the first portion being greater than the width of the second portion, and wherein the electrode is operable to produce first and second electric field amplitudes at locations within the reaction chamber corresponding to the first and second portions of the electrode, respectively, the relative size of the first and second electric field amplitudes varying with time during the etching of the selected materials.

17. The inductively coupled plasma device of claim 8 wherein the electrode includes first and second portions, the width of the first portion being greater than the width of the second portion, and wherein the electrode is operable to produce first and second electric field amplitudes at locations within the reaction chamber corresponding to the first and second portions of the electrode, respectively, and wherein the reaction chamber includes a chamber wall, the first electric field amplitude being produced at a location proximate to the chamber wall, and the second electric field amplitude being produced at a location distal to the chamber wall.

18. The inductively coupled plasma device of claim 8 wherein the electrode includes first and second portions, the width of the first portion being greater than the width of the second portion, and wherein the electrode is operable to produce first and second electric field amplitudes at locations within the reaction chamber corresponding to the first and second portions of the electrode, respectively, and wherein the reaction chamber includes a chamber wall, the first electric field amplitude being produced at a location proximate to the chamber wall, and the second electric field amplitude being produced at a location distal to the chamber wall, the first electric field amplitude being greater than the second electric field amplitude.

19. The inductively coupled plasma device of claim 8 wherein the electrode includes first and second portions, the width of the first portion being greater than the width of the second portion, and wherein the electrode is operable to produce first and second electric field amplitudes at locations within the reaction chamber corresponding to the first and second portions of the electrode, respectively, and wherein the reaction chamber includes a chamber wall, the first electric field amplitude being produced at a location proximate to the chamber wall, and the second electric field amplitude being produced at a location distal to the chamber wall, the first electric field amplitude being less than the second electric field amplitude.

20. The inductively coupled plasma device of claim 8 wherein the electrode includes first and second portions, the width of the first portion being greater than the width of the second portion, and wherein the electrode is operable to produce first and second electric field amplitudes at locations within the reaction chamber corresponding to the first and second portions of the electrode, respectively, and wherein the reaction chamber includes a chamber wall, the first electric field amplitude being produced at a location proximate to the chamber wall, and the second electric field amplitude being produced at a location distal to the chamber wall, the relative size of the first and second electric field amplitudes varying with time during the etching of the selected materials.

21. A plasma chamber for a plasma enhanced depositing device for depositing selected materials during integrated circuit fabrication, comprising:

a chamber having first and second regions, the first region being substantially disjoint from the second region; and an electrode having first and second portions and operable to produce first and second localized electromagnetic coupling strengths within the first and second regions of the chamber, all respectively.

22. The plasma enhanced depositing device of claim 21 wherein the first and second localized electromagnetic coupling strengths are first and second localized electrostatic coupling strengths, respectively.

23. The plasma enhanced depositing device of claim 21 wherein the first and second portions of the electrode provide first and second localized capacitive coupling magnitudes to produce the first and second electromagnetic coupling strengths, all respectively.

24. The plasma enhanced depositing device of claim 21 wherein the first region is greater in extent than the second region, and wherein the first electromagnetic coupling strength is greater than the second electromagnetic coupling strength.

25. The plasma enhanced depositing device of claim 21 wherein the relative size of the first and second electromagnetic coupling strengths varies with time.

26. The plasma enhanced depositing device of claim 21 wherein the electrode is configured as a planar coil electrode and presents a variable width towards the chamber.

27. A plasma enhanced depositing device for depositing selected materials during integrated circuit fabrication, comprising:

a gas supply operable to provide source gas;

a reaction chamber coupled to the gas supply and adapted to receive the integrated circuit and gas from which a plasma is formed;

an electrode positioned proximate to the reaction chamber and operable to receive an electrical signal to ignite a plasma within the reaction chamber, the electrode being configured as a substantially planar coil electrode having a variable width disposed towards the reaction chamber; and a capacitor coupled with the electrode and operable to receive the electrical signal and to produce first and second voltage amplitudes within first and second portions of the electrode, respectively.

28. The plasma enhanced depositing device of claim 27 wherein the width of the first portion of the electrode is greater than the width of the second portion, and wherein the first voltage amplitude is greater than the second voltage amplitude.

29. The plasma enhanced depositing device of claim 27 wherein the width of the first portion of the electrode is greater than the width of the second portion, and wherein the first voltage amplitude is less than the second voltage amplitude.

30. The plasma enhanced depositing device of claim 27 wherein the capacitor is a variable capacitor operable to adjust the relative size of the first and second voltage amplitudes.

31. The plasma enhanced depositing device of claim 27 wherein the width of the first portion of the electrode is greater than the width of the second portion, and wherein the capacitor is operable to adjust the relative size of the first and second voltage amplitudes during the etching of the selected materials.

32. An plasma enhanced depositing system for depositing selected materials during integrated circuit fabrication, comprising:

a gas supply operable to provide source gas;

a power generator operable to provide a power sufficient to produce a plasma from the source gas;

a reaction chamber coupled with the gas supply and adapted to receive the source gas and the integrated circuit;

an electrode coupled with the power generator and operable to receive the power produced by the power generator and correspondingly producing an electromagnetic field for application to the source gas within the reaction chamber to ignite a plasma, the electrode having first and second portions and operable to produce first and second amplitudes of localized capacitive coupling of power within first and second regions of the reaction chamber, all respectively, the first region being substantially disjoint from and greater in extent than the second region; and a dielectric structure positioned between the electrode and the reaction chamber.

33. The plasma enhanced depositing system of claim 32, further comprising a gas removal mechanism coupled with the reaction chamber and operable to remove gas therefrom.

34. The plasma enhanced depositing system of claim 33 wherein the gas removal mechanism includes a vacuum pump.

35. The plasma enhanced depositing system of claim 32, further comprising a gas control panel coupling the gas supply with the reaction chamber and operable to control the flow of gas into the reaction chamber.

36. The plasma enhanced depositing system of claim 32 wherein the power generator is an RF generator.

37. A method of forming a plasma from a gas contained within a chamber, comprising the steps of:

electromagnetically coupling a first power magnitude to a first region of the chamber; and electromagnetically coupling a second power magnitude to a second region of the chamber, the second region being substantially disjoint from and lesser in extent than the first region.

38. The method of claim 37 wherein each of the steps of electromagnetically coupling first and second power magnitudes includes the step of electrostatically coupling the first or second power magnitude, respectively.

39. The method of claim 37 wherein each of the steps of electromagnetically coupling first and second power magnitudes includes the step of capacitively coupling the first or second power magnitude, respectively.

40. The method of claim 39 wherein the steps of capacitively coupling first and second power magnitudes are performed simultaneously, and wherein the first power magnitude is greater than the second power magnitude.

41. The method of claim 39 wherein the steps of capacitively coupling first and second power magnitudes are performed simultaneously, and wherein the first power magnitude is less than the second power magnitude.

42. A plasma enhanced method of depositing a material to a semiconductor structure, comprising:

igniting a plasma from a source gas within a reaction chamber adapted to receive the semiconductor structure;

electrostatically coupling a first region of an electrode having a corresponding first width to the source gas within the reaction chamber at a first localized electrostatic coupling strength; and electrostatically coupling a second region of the electrode having a corresponding second width to the source gas within the reaction chamber at a second localized electrostatic coupling strength simultaneously with electrostatically coupling the first region of the electrode to the source gas, the second width being unequal to the first width.

43. The method of claim 42 wherein the first localized electrostatic coupling strength is less than the second localized electrostatic coupling strength.

44. The method of claim 42 wherein the second localized electrostatic coupling strength is less than the first localized electrostatic coupling strength.

* * * * *